(12) United States Patent
Sercel et al.

(10) Patent No.: US 7,709,768 B2
(45) Date of Patent: *May 4, 2010

(54) SYSTEM AND METHOD FOR CUTTING USING A VARIABLE ASTIGMATIC FOCAL BEAM SPOT

(75) Inventors: Patrick J. Sercel, Brentwood, NH (US); Jeffrey P. Sercel, Hollis, NH (US); Jongkook Park, Nashua, NH (US)

(73) Assignee: JP Sercel Associates Inc., Manchester, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/117,990

(22) Filed: May 9, 2008

(65) Prior Publication Data

US 2008/0242056 A1    Oct. 2, 2008

Related U.S. Application Data

(62) Division of application No. 10/782,741, filed on Feb. 19, 2004, now Pat. No. 7,388,172.

(60) Provisional application No. 60/448,503, filed on Feb. 19, 2003.

(51) Int. Cl.
*B23K 26/38* (2006.01)
*B23K 26/06* (2006.01)

(52) U.S. Cl. .......................... 219/121.72; 219/121.67; 219/121.75

(58) Field of Classification Search ............ 219/121.67, 219/121.68, 121.69, 121.72, 121.75; 359/641, 359/670; 438/463
See application file for complete search history.

(56) References Cited

U.S. PATENT DOCUMENTS 3,626,141 A    12/1971    Daly (Continued)

FOREIGN PATENT DOCUMENTS

DE    4407756 A1 *    9/1995

(Continued)

OTHER PUBLICATIONS

Lam et al., "Laser Ablation of GaN/Sapphire Structure for LED", Dec. 2003, SPIE, Proceedings of SPIE vol. 4830, pp. 114-118.*

(Continued)

*Primary Examiner*—Geoffrey S Evans
(74) *Attorney, Agent, or Firm*—Grossman Tucker Perreault & Pfleger, PLLC

(57) ABSTRACT

A variable astigmatic focal beam spot is formed using lasers with an anamorphic beam delivery system. The variable astigmatic focal beam spot can be used for cutting applications, for example, to scribe semiconductor wafers such as light emitting diode (LED) wafers. The exemplary anamorphic beam delivery system comprises a series of optical components, which deliberately introduce astigmatism to produce focal points separated into two principal meridians, i.e. vertical and horizontal. The astigmatic focal points result in an asymmetric, yet sharply focused, beam spot that consists of sharpened leading and trailing edges. Adjusting the astigmatic focal points changes the aspect ratio of the compressed focal beam spot, allowing adjustment of energy density at the target without affecting laser output power. Scribing wafers with properly optimized energy and power density increases scribing speeds while minimizing excessive heating and collateral material damage.

21 Claims, 8 Drawing Sheets

U.S. PATENT DOCUMENTS

| | | | |
|---|---|---|---|
| 3,629,545 A | 12/1971 | Graham et al. | |
| 3,699,644 A | 10/1972 | Cocca | |
| 3,814,895 A | 6/1974 | Fredriksen | |
| 3,816,700 A | 6/1974 | Weiner et al. | |
| 3,824,678 A | 7/1974 | Harris et al. | |
| 3,970,819 A | 7/1976 | Gates et al. | |
| 3,983,317 A | 9/1976 | Glorioso | |
| 4,043,674 A | 8/1977 | Fletcher et al. | |
| 4,046,985 A | 9/1977 | Gates | |
| 4,203,651 A * | 5/1980 | Persson | 359/670 |
| 4,224,101 A | 9/1980 | Tijburg et al. | |
| 4,237,601 A | 12/1980 | Woolhouse et al. | |
| 4,253,735 A | 3/1981 | Kawamura et al. | |
| 4,336,439 A | 6/1982 | Sasnett et al. | |
| 4,410,237 A | 10/1983 | Veldkamp | |
| 4,433,418 A | 2/1984 | Smith | |
| 4,543,464 A | 9/1985 | Takeuchi | |
| 4,562,333 A | 12/1985 | Taub et al. | |
| 4,664,739 A | 5/1987 | Aurichio | |
| 4,729,971 A | 3/1988 | Coleman | |
| 4,752,922 A | 6/1988 | MacAnally et al. | |
| 4,851,371 A | 7/1989 | Fisher et al. | |
| 4,865,686 A | 9/1989 | Sinohara | |
| 4,921,564 A | 5/1990 | Moore | |
| 4,964,212 A | 10/1990 | Deroux-Dauphin et al. | |
| 4,992,393 A | 2/1991 | Kosaka et al. | |
| 5,057,664 A | 10/1991 | Johnson et al. | |
| 5,075,201 A | 12/1991 | Koh | |
| 5,138,131 A | 8/1992 | Nishikawa et al. | |
| 5,151,389 A | 9/1992 | Zappella | |
| 5,181,224 A | 1/1993 | Snyder | |
| 5,185,295 A | 2/1993 | Goto et al. | |
| 5,214,261 A | 5/1993 | Zappella | |
| 5,248,877 A | 9/1993 | Cooper et al. | |
| 5,385,633 A | 1/1995 | Russell et al. | |
| 5,387,776 A | 2/1995 | Preiser | |
| 5,463,200 A | 10/1995 | James et al. | |
| 5,543,365 A | 8/1996 | Wills et al. | |
| 5,552,345 A | 9/1996 | Schrantz et al. | |
| 5,626,777 A | 5/1997 | Hugl et al. | |
| 5,627,109 A | 5/1997 | Sassa et al. | |
| 5,631,190 A | 5/1997 | Negley | |
| 5,632,083 A | 5/1997 | Tada et al. | |
| 5,641,416 A | 6/1997 | Chadha | |
| 5,690,845 A | 11/1997 | Fuse | |
| 5,703,713 A | 12/1997 | Leong et al. | |
| 5,796,700 A | 8/1998 | Lee et al. | |
| 5,801,356 A | 9/1998 | Richman | |
| 5,809,987 A | 9/1998 | Wark et al. | |
| 5,811,751 A | 9/1998 | Leong et al. | |
| 5,847,746 A | 12/1998 | Takahashi | |
| 5,864,171 A | 1/1999 | Yamamoto et al. | |
| 5,864,430 A | 1/1999 | Dickey et al. | |
| 5,872,046 A | 2/1999 | Kaeriyama et al. | |
| 5,912,477 A | 6/1999 | Negley | |
| 5,922,224 A | 7/1999 | Broekroelofs | |
| 5,932,118 A | 8/1999 | Yamamoto et al. | |
| 5,961,852 A | 10/1999 | Rafla-Yuan et al. | |
| 5,963,364 A | 10/1999 | Leong et al. | |
| 5,976,691 A | 11/1999 | Noguchi et al. | |
| 5,987,920 A | 11/1999 | Bosman et al. | |
| 5,994,205 A | 11/1999 | Yamamoto et al. | |
| 6,057,525 A | 5/2000 | Change et al. | |
| 6,107,162 A | 8/2000 | Morita et al. | |
| 6,117,347 A | 9/2000 | Ishida | |
| 6,121,118 A | 9/2000 | Jin et al. | |
| 6,130,401 A | 10/2000 | Yoo et al. | |
| 6,140,151 A | 10/2000 | Akram | |
| 6,219,169 B1 | 4/2001 | Iizuka | |
| 6,225,194 B1 | 5/2001 | Noguchi et al. | |
| 6,266,302 B1 | 7/2001 | Yamanaka | |
| 6,301,059 B1 * | 10/2001 | Huang et al. | 359/670 |
| 6,341,029 B1 | 1/2002 | Fillion et al. | |
| 6,365,429 B1 | 4/2002 | Kneissl et al. | |
| 6,413,839 B1 * | 7/2002 | Brown et al. | 438/463 |
| 6,472,295 B1 | 10/2002 | Morris et al. | |
| 6,509,546 B1 | 1/2003 | Egitto et al. | |
| 6,555,447 B2 * | 4/2003 | Weishauss et al. | 438/460 |
| 6,580,054 B1 | 6/2003 | Liu et al. | |
| 6,676,878 B2 | 1/2004 | O'Brien et al. | |
| 6,777,645 B2 | 8/2004 | Ehrmann et al. | |
| 6,881,529 B2 | 4/2005 | Iwasaki | |
| 7,148,447 B2 | 12/2006 | Ehrmann et al. | |
| 5,611,946 A1 | 12/2008 | Leong et al. | |
| 2002/0031899 A1 | 3/2002 | Manor | |
| 2002/0149136 A1 | 10/2002 | Baird et al. | |
| 2002/0162604 A1 | 11/2002 | Matile | |
| 2002/0170898 A1 | 11/2002 | Ehrmann et al. | |
| 2002/0177288 A1 | 11/2002 | Brown et al. | |

FOREIGN PATENT DOCUMENTS

| | | | |
|---|---|---|---|
| EP | 1137 072 | | 9/2001 |
| JP | 55-151351 | | 11/1980 |
| JP | 56-6451 | | 1/1981 |
| JP | 57-6650 | | 1/1982 |
| JP | 57-81985 | | 5/1982 |
| JP | 58-44738 | | 3/1983 |
| JP | 58-44739 | | 3/1983 |
| JP | 58-68946 | | 4/1983 |
| JP | 61-219535 | | 9/1986 |
| JP | 63-174793 | | 7/1988 |
| JP | 63-183885 | | 7/1988 |
| JP | 04-167987 A | * | 6/1992 |
| JP | 04-167989 A | * | 6/1992 |
| JP | 5-211381 | | 8/1993 |
| JP | 10034363 | | 2/1998 |
| JP | 10-64854 | | 3/1998 |
| JP | 11163403 | | 6/1999 |
| JP | 11-224866 | | 8/1999 |
| JP | 2000-4066 | | 1/2000 |
| JP | 2000-196186 | | 7/2000 |
| JP | 2000199848 | | 7/2000 |
| KR | 0164647 | * | 1/1999 |
| WO | WO 00/75983 | | 12/2000 |
| WO | WO 02/41362 | | 5/2002 |
| WO | WO 03/028943 | | 4/2003 |
| WO | WO2007/108589 | | 9/2007 |

OTHER PUBLICATIONS

Japanese Notice of Reasons for Rejection issued in related Japanese Patent Application No.

Supplemental EPO Search Report dated May 23, 2008 received in corresponding EPO Application No. 04712846.7, 3 pgs.

Foreign Office Action dated Jun. 20, 2008 received in corresponding Chinese Application No. 200480007688.0, 18 pgs.

Price quote documents dated from Jul. 22, 2002 to Nov. 25, 2002.

Written Opinion mailed May 12, 2005, received in corresponding PCT application No. PCT/US04/04897 (3 pgs).

T. Villenuve, "Nanosecond pulsed laser improve micro-machining", DesignNews (Reed Elsevier Inc.) 2001 Issue 11 pp. 33-35, Jun. 4, 2001.

D.Hellrung et al, "High-Accuracy Micromachining of Ceramics by Frequency-Tripled Nd:YAG-Lasers", Proceedings of the SPIE-The International Society for Optical Engineering, vol. 3618 pp. 348-356, Nov. 25-27, 1999.

Lee, Jong-Moo et al, "Scribing Blue LED Wafer Using Laser-Induced Plasma-Assisted Ablation With a Q-Switched Nd: YAG Laser", Proceedings of SPIE, Laser Application in Microelectronic and Optoelectronic Manufacturing V, vol. 3933, Jan. 24-26, 2000, pp. 237-244.

A. Ostendorf et al, "Material Processing Applications for Diode Pumped Solid State Lasers", Lambda Highlights, Lambda Physik, No. 57, May 2000, pp. 1-8.

Powell, Paula M., Senior Editor, "Diode-Pumped Solid-State Lasers:Manufacturing Matters", 2002 Global Photonics Market Forecast.

Park, Jongkook and Sercel, Patrick, "High-Speed UV Laser Scribing Boosts Blue LED Industry", CompoundSemiconductor, vol. 8, No. 11, Dec. 2002.

Wiener-Avnear, Eli, "Laser Micromachining Creates Precise 3-D Structures", Laser Focus World-Optoelectronics and Laser Technology Advances, Nov. 1998, pp. 1-4.

Lambda Physik, Lambda Highlights No. 18, "New Resist for 248 NM Successfully Investigated", Aug. 1989, pp. 1-4.

Lambda Physik, "Gator", DPSS Lasers—Gator Series, May 2003.

Oxford Lasers, "Sapphire Wafer Scribing System", www.oxfordlasers.com. cited by other . MEMS and Nanotechnology Clearinghouse, "JPSA Announces The IX-1000 Laser Microdice System", www.memsnet.org, Jan. 6, 2004.

J. Radtke et al, "High-Precision Micro Cutting of Ceramics with Short-Pulsed Solid-State Lasers", Proceedings of SPIE—The International Society for Optical Engineering, vol. 4088 pp. 252-255, Jun. 14-16, 2000.

S.V. Govorkov et al, "High-Throughput Micromachining o Steel and Ceramics with Solid-State UV Laser", Proceedings of SPIE-The International Society for Optical Engineering, vol. 4065 pp. 790-800, Apr. 24-28, 2000.

Sercel, Jeffrey P., "Optimized Beam Delivery for Industrial Excimer Lasers—Excimers Fill a Niche in High-Precision Processing", Photonics Spectra, Dec. 1991.

S.K. Nikumb and M.U. Islam, "High-precision machining of materials for manufacturing applications using diode pumped solid state lasers", Proceedings of SPIE-The International Society for Optical Engineering, vol. 3888 pp. 188-197, Nov. 1-5, 1999.

H.M. Lam et al, "Laser Ablation of GaN/Sapphire Structure for LED," Proceedings of SPIE-The International Society for Optical Engineering, vol. 4830, pp. 114-118, May 27-31, 2002.

Electronicstalk.com, "Deep UV Lasers Scribing System Boosts LED Yields", Nov. 29, 2002, Pro-Talk Limited, UK.

New Wave Research—Merchantek Products, Press Release—"New Wave Research Unveils High Performance Deep UV Laser Ablation System", Jan. 31, 2001.

New Wave Research—Merchantek Products, Press Release—"New Wave Research Introduces QuikLaze-50 for Microelectronics Machining", May 8, 2001.

New Wave Research—Merchantek Products, Press Release—"New Wave Research Unveils Compact, Tabletop Microelectronics Machining System", Nov. 26, 2001.

Herbst, Ludolf et al, "High Peak Power Solid State Laser for Micromachining of Hard Materials", Lambda Physik AG, Hans-Boeckler-Strasse 12, Goettingen, Germany; Lambda Physik Inc., 3201 West Commercial Blvd., Ft. Lauderdale, USA; Fraunhofer Institute of Material and Beam Technology, Winterbergstrasse 28, Dresden, Germany, Jan. 7, 2003.

Weiner, Kurt H. et al, IPCOM1616D: Laser-assisted Fabrication of Bipolar Transistors in Silicon-On-Sapphire (SOS), Application No. US1991000762538, Publication Date: Sep. 12, 2000, Thomson-Delphion.

Razvan, Stoian et al, "Laser Ablation of Sapphire With Ultrashort Pulses", Publication: Proc. SPIE vol. 3885, p. 121-131, High-Power Laser Ablation II, Publication Date: Feb. 2000.

Opt. Eng., vol. 40, p. 2822, Seq# 1, Laser-Induced Temperature Distributions and Thermal Deformations in Sapphire, silicon, and Calcium Fluoride Substrates at 1.315 um., Yufeng Peng et al, Mar. 5, 2001.

Todd Lizotte and Orest Ohar, "UV Nd:YAG Laser Technology", pp. 17-19, Lasers & Optronics, vol. 13, No. 9, Sep. 1994.

Todd Lizotte, "Removal of UV YAG or Excimer Laser Debris After Mocrovia Drilling", pp. 1-5, Advanced Packaging, Jan. 2002.

Todd E. Lizotte, "Beam Shaping for Microvia Drilling", pp. 28-33, PC FAB, Feb. 2003.

International Search Report mailed May 12, 2005 received in corresponding PCT application No. PCT/US04/04897 (3pgs).

Chinese Office Action dated Apr. 10, 2009 issued in related Chinese Patent Application No. 200480007688.0.

Chinese Office Action dated Jul. 17, 2009 issued in related Chinese Patent Application No. 200480007688.0.

* cited by examiner

SYSTEM AND METHOD FOR CUTTING USING A VARIABLE ASTIGMATIC FOCAL BEAM SPOT

CROSS-REFERENCE TO RELATED APPLICATIONS

This application is a divisional of U.S. patent application Ser. No. 10/782,741 filed Feb. 19, 2004, now U.S. Pat. No. 7,388,172 which claims the benefit of U.S. Provisional Patent Application Ser. No. 60/448,503, filed on Feb. 19, 2003, which is fully incorporated herein by reference.

TECHNICAL FIELD

This invention relates to laser cutting or machining, and more particularly, relates to a system and method for forming a variable astigmatic focal beam spot using solid-state lasers with an anamorphic beam delivery system to scribe semiconductor wafers.

BACKGROUND INFORMATION

Increasing worldwide demand for compound semiconductor devices has driven the development of high throughput, cost effective, and reliable production techniques and equipment. Compound semiconductors are comprised of a combination of group-III elements, such as B, Al, Ga, In and Tl, and group-V elements, such as N, P, As, Sb and Bi. A typical example of III-V compound semiconductor devices is light emitting diodes (LEDs) using InP, GaP, GaAs, AlInGaP and GaN.

Among theses LEDs, blue LEDs consist of multiple Gallium Nitride-based layers epitaxially grown on a silicon carbide or sapphire wafer substrate. Silicon carbide wafers have been diced using high-precision saws. Sapphire wafer die separation has been performed by mechanical scribing with a diamond tool. The wafer can then be cleaved along the scribed lines via a fracturing machine. The extreme hardness of blue LED substrates and the small LED die size create significant problems for both saw dicing and mechanical scribing, including low die yield, low throughput, and high operating costs. The brittle substrates, such as GaP and GaAs, also show low productivity due to excessive edge chipping by the mechanical scribe and break and the saw dicing processes. Moreover, the conventional processes require relatively large cutting areas, reducing the number of devices on a wafer.

Scribing with ultra violet (UV) lasers has emerged as an alternative method for separating compound semiconductor wafers. Excimer lasers and diode pumped solid-state (DPSS) lasers are two major light sources for UV laser scribing. When short duration UV laser light pulses are tightly focused onto the wafer surface, each pulse is absorbed into a sub-micron thick surface layer, which then vaporizes. The vaporized material carries away the energy of the interaction, minimizing heat transfer to the surrounding material. This process is known as photo-ablation. In order to produce deep cuts, hundreds of successive laser pulses are focused onto the surface.

Moving the wafer under a rapidly pulsed, focused laser beam produces an extremely narrow 'V' shaped cut, the depth of which is controlled by the scan speed. Typically, these cuts terminate 30-50% into the thickness of the wafer. After laser scribing, the wafer is fractured using standard cleaving equipment. The 'V' shaped laser cuts act as stress concentrators, inducing well-controlled fracturing with excellent die yield.

Efficient photo-ablation is preferred for laser scribing and depends strongly on two properties of the UV laser light: wavelength and pulse duration. In general, photo-ablation benefits from shorter laser wavelength and shorter pulse duration for both optical and thermal reasons. In the formula, $E=h(c/\lambda)$, the photon energy, E, is inversely proportional to $\lambda$, the photon wavelength. Simply put, shorter wavelengths impart more energy per photon. The benefits achieved by short laser wavelengths include improved optical absorption, reduced absorption depth, lower irradiance required for ablation, and reduced cut width. In the formula, $I=E/At$, the irradiance, I, is proportional to pulse energy, E, and inversely proportional to both beam area, A, and pulse duration, t. As a result, short pulse durations result in higher irradiances for a given spot size and pulse energy. Also, short pulses deliver successful ablation at larger spot sizes on target, resulting in more rapid cutting. The benefits achieved by short laser pulse duration include increased irradiance on target, and reduced heat transfer to the substrate due to more rapid absorption and ablation.

In silicon carbide, optical wavelengths below 370 nm have photon energies that exceed the bandgap of the material, resulting in direct photon absorption. For example, the photonic energy of a DPSS 355 nm solid state laser beam (3.5 eV) is higher than the highest bandgap of silicon carbide (3.27 eV for 4H polytype), resulting in strong absorption followed by ablation. Sapphire, conversely, has a bandgap (9.9 eV) that is higher than the photon energy of commercially-available UV lasers, for example, an $F_2$ laser at 157 nm (7.9 eV). In such cases, multi-photon absorption can induce efficient optical absorption and the necessary irradiance (W/cm$^2$) for multi-photon absorption can be very high. The efficiency of multi-photon absorption in sapphire is strongly wavelength-dependent. Shorter wavelengths are absorbed more completely in sapphire, resulting in less heat input to the bulk material. For photo-ablation to occur, light that is absorbed must impart sufficient energy to vaporize the material. The threshold irradiance for ablation is also strongly wavelength-dependent. The higher photon energy and smaller absorption depth of shorter optical wavelengths result in ablation at lower irradiance levels.

As compared to the sapphire, compound semiconductor substrates usually have lower bandgap energy, such as GaN (3.3 eV), GaP (2.26 eV) and GaAs (1.42 eV). Although coupling of a UV laser at 266 nm is efficient on these substrates, excessive photonic energy under this strong absorption can result in unnecessary thermal conduction to the substrates, causing heat related damages. In contrast, insufficient laser energy density can result in improper ablation, even with the strong absorption. Thus, an optimum laser energy density or irradiance is an important factor in laser scribing, which leads to a higher scribing speed and/or maximized productivity.

Among UV lasers, excimer lasers generate the most power output, e.g., nearly 100 watts in the deep UV range. These advantages have made the excimer laser uniquely suited for hard LED wafer scribing. Scribing using excimer laser technology has involved the delivery of a line beam or series of line beams onto an LED wafer, which is translated by a controlled motion stage to be diced in a desired direction. Excimer laser scribing, for example, using KrF 248 nm light output, utilizes a near-field imaging technique through which a patterned laser beam is projected from a mask. Thus, the delivery of a line beam has been achieved by line-patterned mask projection. One example of the use of excimer laser patterned projections is disclosed in U.S. Pat. No. 6,413,839, incorporated herein by reference. In this patent, a single line beam and multiple line beams are projected onto a sapphire wafer with blue LEDs.

When using a mask with excimer laser projection techniques, the modification of a patterned beam is relatively simple and is achieved by changing the shape of the mask. For example, the narrow line beam for scribing (i.e., usually in tens of microns) is projected by a slit mask. However, the slit mask transmits the laser beam only through an open area of the mask. Thus, introducing the mask in a beam delivery system (BDS) blocks a major portion of the laser beam, which makes the beam utilization factor (BUF) low. This low beam utilization factor limits the speed of the scribing process, because the scribing speed is mainly proportional to the size of the projected beam in the scribing translation direction.

Recently, developments in UV solid-state laser technology have resulted in DPSS lasers with sufficient average power to be considered for the scribing of hard compound semiconductor wafers, such as those made of sapphire and silicon carbide. A few laser manufacturers have developed the third harmonic (355 nm) and the fourth harmonic (266 nm) DPSS lasers with a gain medium for $Nd^{3+}$ ions doped in a yttrium\crystalline matrix ($Nd:YVO_4$ or $Nd:YAG$). These frequency-multiplied DPSS lasers demonstrate significant improvements in pulse duration, frequency and power output. For example, UV solid-state lasers running at the third harmonic (355 nm) now achieve average powers of over 5 Watts, and the fourth harmonic (266 nm) lasers achieve average powers of over 2.5 Watts. Also, these lasers offer short pulse durations, e.g., below 20 nanoseconds. UV solid-state lasers with short wavelength and pulse duration (e.g., less than 15 nanoseconds) can create extremely high irradiance, e.g., over $10^9$ W/cm$^2$, resulting in instantaneous vaporization by photonic bombardment. This extreme irradiance of frequency-multiplied DPSS lasers makes the separation of the hard substrate possible. For an example, although the sapphire has a high optical transmissivity to UV wavelengths, this extreme temporal and spatial concentration of photons results in effective multi-photon absorption, causing ablation.

Generally, UV solid-state lasers generate a circular Gaussian beam in $TEM_{00}$ mode and current methods of UV solid-state laser scribing utilize a focused circular beam spot. Unlike an excimer laser BDS, DPSS lasers utilize far field imaging, which does not require patterned mask imaging. Examples of laser scribing using far field imaging are disclosed in U.S. Pat. No. 5,631,190 and U.S. Pat. No. 6,580, 054, incorporated herein by reference. The raw beam from the laser resonator is directly focused by a beam-focusing lens and is delivered to the target. The BUF is higher because the BDS for a DPSS laser utilizes the full beam. The scribing speed is slower, however, due to the small size of the focused beam spot, which is one drawback of the application of the DPSS laser to mass-production. Also, the conventional beam delivery system used in a DPSS laser has a limited ability to control the adjustment of laser processing parameters. In the conventional scribing techniques using DPSS lasers, laser processing parameters are controlled by adjusting laser output power and the directed laser light is not modified.

In general, laser beams must be focused for laser material processing applications. A focused laser beam has two important characteristics; 1) optimum laser intensity (usually expressed by the laser energy density J/cm$^2$) for a target material, and 2) minimum size of a focused spot or a beam waist diameter. The optimum laser intensity is important to achieving a desired processing result, because either excessive or insufficient laser intensity will introduce imperfections into the process. In addition, the focused beam spot should have sufficient flexibility to adjust its intensity, since the optimum intensity is determined by the light absorption properties of the particular target material. The minimum size of a beam waist diameter is important when laser material processing requires a sharply focused beam for fine resolution.

Another issue with laser scribing processes is caused by the ablation induced debris generated along the wake of the cut. The debris on the semiconductor dies or LED dies are detrimental to both their performance and packaging. Photoresists for lithography have been applied on substrate surfaces for the protective coating to prevent the debris, but the photoresist tends to be carbonized by the heat from the laser induced plasma. The carbonized photoresist is hard to remove, especially near the laser cuts. Adhesive tapes have also been proposed as protection, but related procedures, such as changing the adhesive tape after scribing in every single direction, are not conducive to mass production. In addition, excessive amounts of residue remained after the laser scribing because of the high thickness of the tape together with the adhesive.

Accordingly, there is a need for a laser scribing system and method that avoids the drawbacks of the existing techniques, is capable of using shorter wavelengths and pulse duration, and is capable of optimizing laser intensity and minimizing beam waist diameter.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENTS

Overview of BDS

Figure 1:
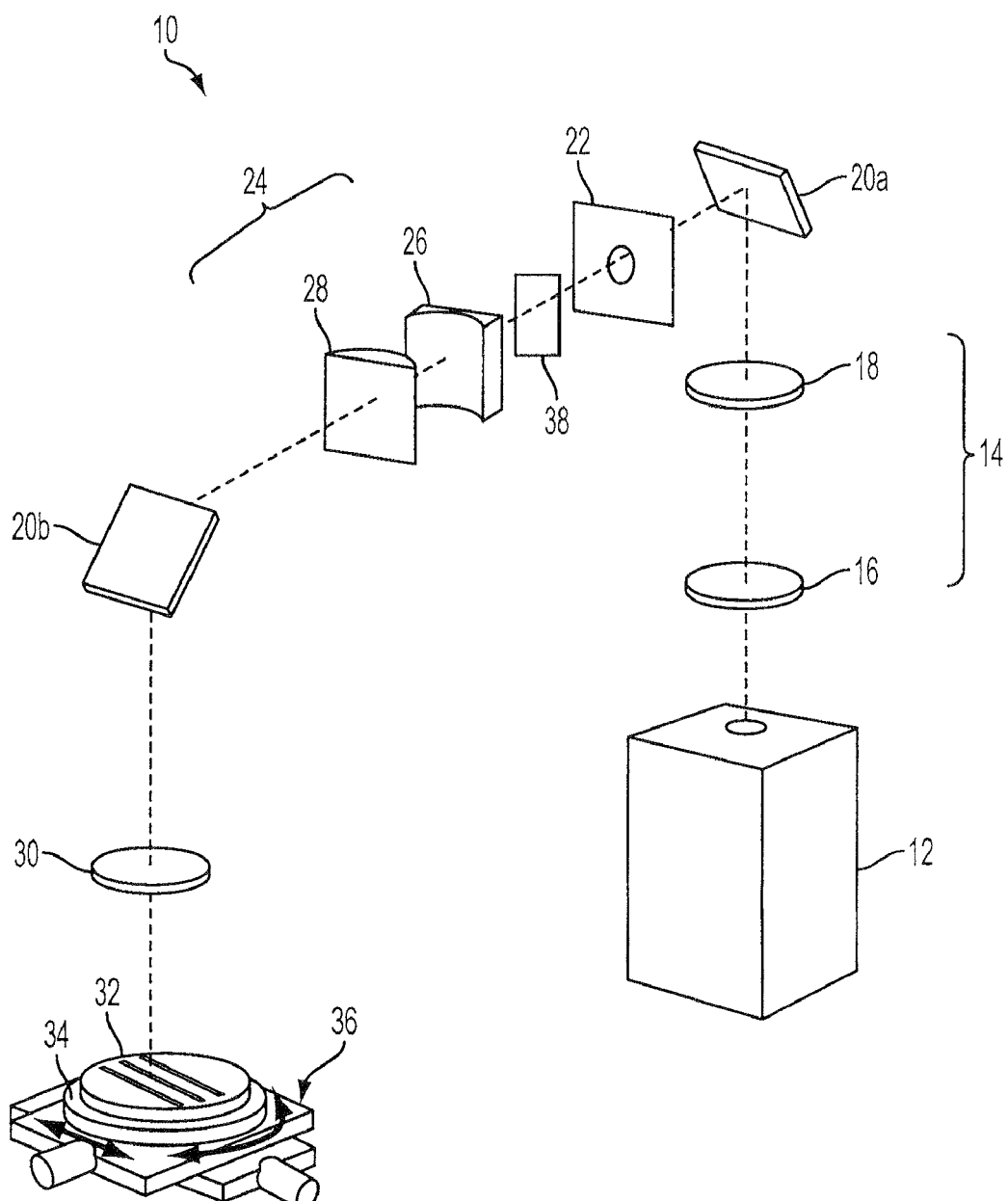
FIG. 1 is a schematic diagram of a beam delivery system (BDS) with astigmatic focal point optics, according to one embodiment of the present invention.

Referring to FIG. 1, one embodiment of an anamorphic beam delivery system (BDS) 10 is described in detail. The anamorphic BDS 10 generates an astigmatic focal beam spot that can be used to cut or machine a substrate made of various types of materials. In one exemplary application, the preferred embodiment of the BDS 10 improves the productivity of LED die separation by forming a highly-resolved adjustable astigmatic focal beam spot, which maximizes scribing speed and minimizes consumption of scribing-related real estate on a wafer. The BDS 10 can also be used in other scribing or cutting applications.

In the embodiment shown, a solid-state laser 12, preferably diode pumped, generates a laser beam in the UV range, preferably the third harmonic 355 nm or the fourth harmonic 266 nm. The raw laser beam is usually in $TEM_{00}$ mode with Gaussian distribution and is enlarged by a beam-expanding telescope (BET) 14. The exemplary embodiment of the BET 14 is composed of the spherical plano-concave lens 16 and spherical plano-convex lens 18. Magnification of the BET 14 is determined by the focal lengths of each lens, generally described by $M=(|f_{sx}|/|f_{sv}|)$, where M is magnification, $f_{sx}$ is a focal length of the spherical plano-convex lens 18 and $f_{sv}$ is a focal length of the spherical plano-concave lens 16. To effect collimated beam expansion, the distance between the spherical plano-concave lens 16 and the spherical plano-convex lens 18 is determined by a general equation, $D_c = f_{sx} + f_{sv}$, where $D_c$ is a collimation distance. Combinations of $f_{sx}$ and $f_{sv}$ can be used to satisfy designed values of the magnification M and the collimation distance $D_c$. The range of M can be about 2× to 20×, and is preferably 2.5× in the exemplary BDS 10. Based on this preferred magnification of 2.5×, a combination of $f_{sx}=250$ mm and $f_{sv}=100$ mm with $D_c=150$ mm is preferably used in this BDS 10.

In the preferred embodiment, the expanded beam is reflected by the 100% mirror 20a and then directed to the beam shaping iris 22. The beam shaping iris 22 symmetrically crops out the low intensity edges of the beam in a Gaussian profile, leaving a high intensity portion passing through the iris 22. The beam is then directed to the center of a variable anamorphic lens system 24.

The exemplary variable anamorphic lens system 24 is composed of a cylindrical plano-concave lens 26 and a cylindrical plano-convex lens 28. The constituents of the variable anamorphic lens system 24 preferably satisfy a condition, $|f_{cx}|=|f_{cv}|$ where $f_{cx}$ is a focal length of the cylindrical plano-convex lens 28 and $f_{cv}$ is a focal length of the cylindrical plano-concave lens 26. In the variable anamorphic lens system 24, the incident beam is asymmetrically modified in one of the two principal meridians, which appears in the horizontal direction in FIG. 1. In the anamorphic lens system 24, when $D<D_c$, where D is a distance between a cylindrical plano-concave lens 26 and a cylindrical plano-convex lens 28 and $D_c$ is a collimation distance, a parallel incident beam is diverging after the anamorphic lens system 24. In contrast, when $D>D_c$, a parallel incident beam is converging after the anamorphic lens system 24. In the preferred embodiment of the anamorphic lens system 24 shown in FIG. 1, the collimation distance is $D_c=f_{cx}+f_{cv}=0$, because $|f_{cx}|=|f_{cv}|$ and $f_{cx}$ has a positive value and $f_{cv}$ a negative value and $D \geq D_c$. Accordingly, when $D>0$, the collimated incident beam is converging after the anamorphic lens system 24.

The degree of convergence or combined focal length ($f_{as}$) of the anamorphic system 24 is governed by the distance D, and it is generally expressed by the two lens principle: $f_{as}=f_{cx}f_{cv}/(f_{cx}+f_{cv}-D)$. Namely, the larger the distance D, the shorter the focal length $f_{as}$. When the distance D increases, the degree of convergence increases in only one principal meridian of the collimated incident beam. One principal meridian of the incident beam loses its collimation and converges after the variable anamorphic lens system 24; however the other principal meridian is not affected and keeps its beam collimation. Consequently, the size of the beam after the variable anamorphic lens system 24 is changed in only one principal meridian by adjusting the distance between the two lenses in the anamorphic system 24. Thus, the anamorphic BDS 10 deliberately introduces astigmatism to produce focal points separated in two principal meridians, i.e. vertical and horizontal. Although a series of anamorphic lenses in different focal lengths or convergences is preferred to provide a variable astigmatic beam spot, the variable anamorphic lens system can be replaced by a single anamorphic lens for a fixed convergence.

After the variable anamorphic lens system 24, the beam is reflected by another 100% mirror 20b, and then directed to the center of a beam focusing lens 30. The exemplary beam focusing lens 30 is an aberration corrected spherical multi-element lens having a focal length range between about +20 mm to +100 mm. In one embodiment of the BDS 10, an edge-contact doublet with +50 mm focal length is used. After the beam focusing lens 30, one of the astigmatic focal points is sharply focused on a substrate 32, such as a semiconductor wafer. In one preferred embodiment, the substrate 32 is translated by computer controlled x-y motion stages 34 for scribing. In semiconductor scribing applications where the semiconductor wafer contains square or rectangular dies, the semiconductor wafer can be rotated 90 degrees by a rotary stage 36 for scribing in both the x direction and the y direction.

The preferred combination of the BET 14 and the multi-element beam focusing lens 30 yields a highly-resolved and adjustable astigmatic focal beam spot with minimal aberration and a minimized beam waist diameter. In general, a minimum beam waist diameter ($w_o$) of a Gaussian beam can be expressed by: $w_o=\lambda f/\pi w_i$ where $\lambda$ is a wavelength of an incident laser beam, f is a focal length of a beam focusing lens, $\pi$ is the circular constant, and $w_i$ is a diameter of the incident beam. In a given beam focusing lens 30, the minimum beam waist diameter ($w_o$) or a size focused spot is inversely proportional to the incident beam diameter ($w_i$). In the exemplary embodiment of the present invention, the BET 14 anamorphically increases the incident beam diameter ($w_i$) which is focused by the multi-element beam focusing lens 30, resulting in a minimized beam waist diameter and yielding a highly-resolved focal beam spot. This provides a sharply focused scribing beam spot capable of providing about 5 μm or less scribing kerf width on a semiconductor wafer. Consequently, the minimized scribing kerf width significantly reduces consumption of real estate on a wafer by scribing, which allows more dies on a wafer and improves productivity.

The combination of the variable anamorphic lens system 24 and the high resolution beam focusing lens 30 results in two separate focal points in each principal meridian of the incident beam. The flexibility of changing beam convergence from the variable anamorphic lens system 24 provides an instant modification of a laser energy density on a target semiconductor wafer. Since the optimum laser energy density is determined by light absorption properties of the particular target semiconductor wafer, the variable anamorphic lens system 24 can provide an instant adaptation to the optimum processing condition determined by various types of semiconductor wafers.

Although one exemplary embodiment of the anamorphic BDS 10 is shown and described, other embodiments are contemplated and within the scope of the present invention. In particular, the anamorphic BDS 10 can use different components to create the astigmatic focal beam spot or the anamorphic BDS 10 can include additional components to provide further modification of the beam.

In one alternative embodiment, a bi-prism 38 or a set of bi-prisms can be inserted between the anamorphic lens system 24 and the BET 14. The bi-prism equally divides the expanded and collimated beam from the BET 14, then crosses the two divided beams over to produce an inversion of half Gaussian profile. When a set of bi-prisms is used, the distance between the two divided beams can be adjusted by changing the distance between the set of bi-prisms. In other words, the bi-prism 38 divides the Gaussian beam by half circles and inverts the two divided half circles. A superimposition of these two circles creates superimposition of the edges of Gaussian profiles in weak intensity. This inversion of a Gaussian profile and intensity redistribution creates a homogeneous beam profile and eliminates certain drawbacks of a Gaussian intensity profile.

In another embodiment, the BDS 10 can include an array of anamorphic lens systems 24 used to create small segments of separated astigmatic 'beamlets', similar to a dotted line. The astigmatic beamlets allow an effective escape of laser-induced plasma, which positively alters scribing results. The distance between the lenses in the array of anamorphic lens systems controls the length of each segment of the beamlets. The distance among the segments of the beamlets can be controlled by introducing a cyclindrical plano-convex lens in front of the array of anamorphic lens systems.

Generation of Variable Astigmatic Focal Beam Spot

Figure 2:
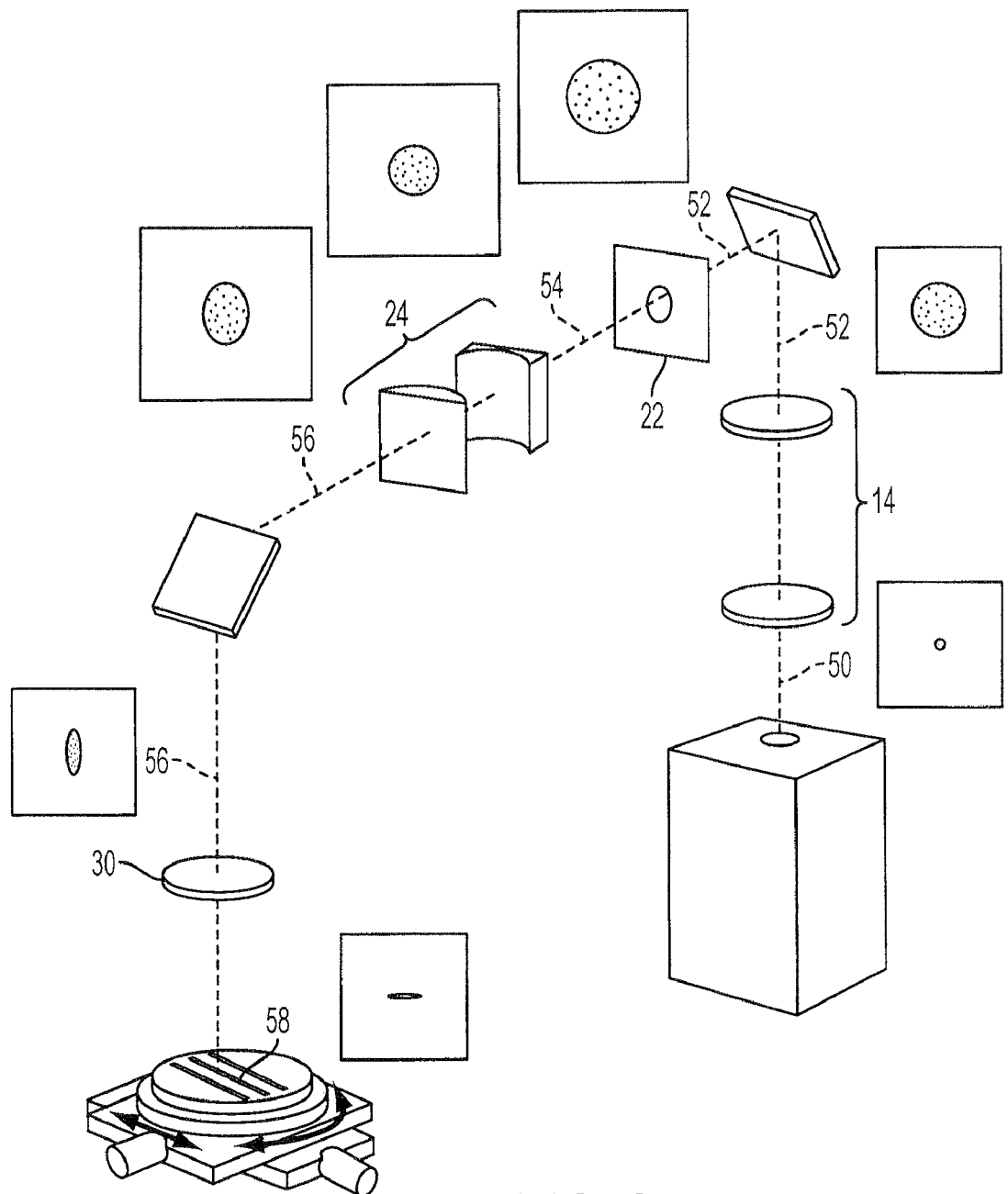
FIG. 2 is a schematic diagram of the BDS shown in FIG. 1 illustrating the sequential modification of the laser beam from the laser to the target.

Referring to FIG. 2, one method of forming a variable astigmatic focal beam spot is described in greater detail. The profile of raw beam 50 from the laser generally has about 0.5 mm to 3 mm of diameter in a Gaussian distribution. The raw beam 50 is expanded by the BET 14 and the expanded beam 52 is about 2.5 times larger in diameter. The expanded beam 52 is passed through the beam shaping iris 22 for edge cropping and the expanded and edge-cropped beam 54 is directed to the center of the anamorphic lens system 24. The anamorphic lens system 24 modifies the expanded and edge-cropped beam 54 in only one principle meridian, resulting in a slightly compressed beam shape 56. As the slightly compressed laser beam 56 travels towards the beam focusing lens 30, the degree of astigmatism is increased in the beam shape since the variable anamorphic lens system 24 makes the beam converge in only one principal meridian. Subsequently, the highly compressed beam 57 passes through the beam focusing lens 30 to form the astigmatic focal beam spot 58. Since the highly compressed beam 57 has converging beam characteristics in one principal meridian and collimated beam characteristics in the other, focal points are formed separately in each principal meridian after the beam focusing lens 30. Although this method of forming the astigmatic focal beam spot 58 is described in the context of the exemplary BDS 10, this is not a limitation on the method.

Figure 3:
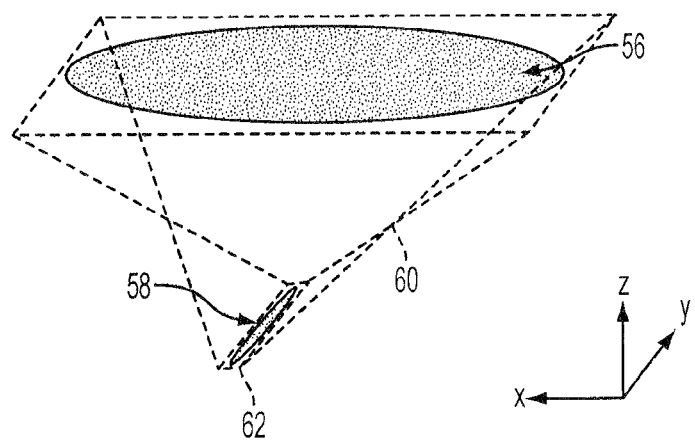
FIG. 3 is a cross-sectional view of a beam, illustrating the formation of two focal points separately in each principal meridian.

The three-dimensional diagram in FIG. 3 illustrates in greater detail the formation of the two focal points separately in each principal meridian when the highly compressed beam 57 passes through the beam focusing lens (not shown). Since the highly compressed beam 57 in one principal meridian (hereinafter the 'y component') has converging characteristics, the y component exhibits the short distance focal point 60. In contrast, since the other meridian (hereinafter the 'x component') has collimating beam characteristics, the x component exhibits the long distance focal point 62. Combination of the x and y components results in the astigmatic beam spot 58.

Figure 4:
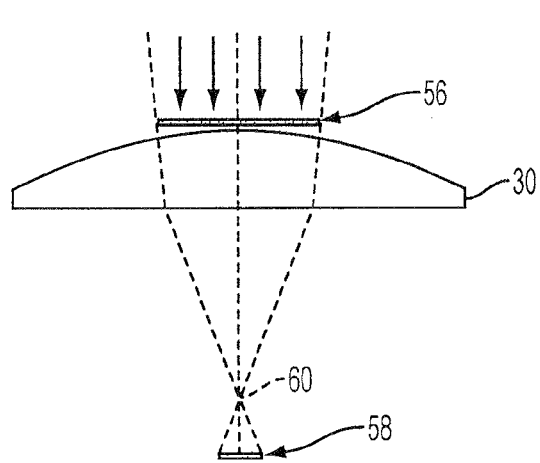
FIG. 4 is a cross-sectional view of a beam focusing lens in the BDS shown in FIG. 1, illustrating the 'y component' of the highly compressed beam passing through the beam focusing lens.

FIG. 4 shows the y component of the highly compressed beam 57, which passes through the beam focusing lens 30 and results in the focal point 60. After the focal point 60, the beam diverges and creates the astigmatic side of the beam spot 58.

Figure 5:
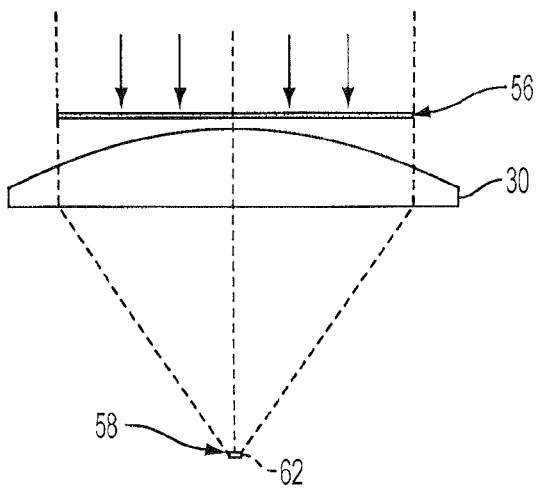
FIG. 5 is a cross-sectional view of a beam focusing lens in the BDS shown in FIG. 1, illustrating the 'x component' of the highly compressed beam passing through the beam focusing lens.

FIG. 5 shows the x component of the highly compressed beam 57, which passes through the beam focusing lens 30 and results in the focal point 62. The collimated x component of the highly compressed beam 57 is sharply focused at the focal point 60, which creates the sharply focused side of the astigmatic beam spot 58.

Figure 6:
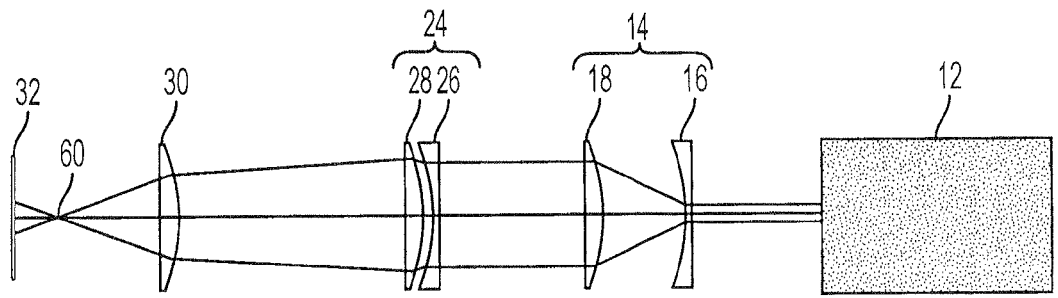
FIG. 6 is a cross-sectional view of the BDS shown in FIG. 1, illustrating the formation of two separated focal points in one principal meridian.
Figure 7:
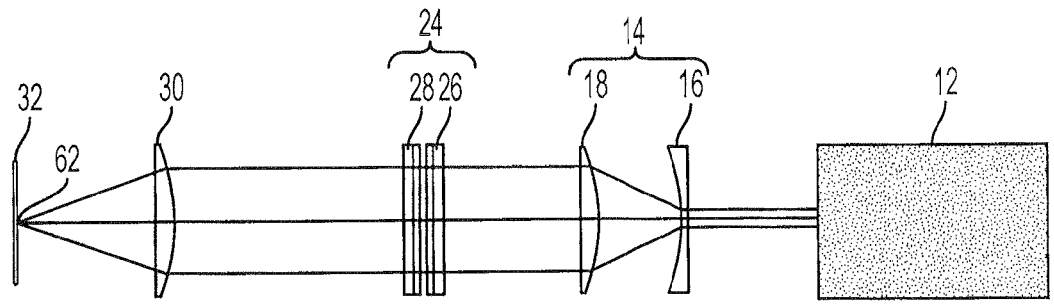
FIG. 7 is a cross-sectional view of the BDS shown in FIG. 1, illustrating the formation of two separated focal points in the other principal meridian.

FIGS. 6 and 7 illustrate further the formation of two separated focal points 60, 62 in each principal meridian. The schematic beam tracings in FIGS. 6 and 7 include two-dimensional layouts of the BDS 10 shown in FIG. 1 excluding the 100% mirrors 20a, 20b and the beam shaping iris 22 for simplicity. In FIG. 6, the raw beam from the solid-state laser 12 is expanded by the BET 14 and then collimated. The variable anamorphic lens system 24 modifies the collimated beam in this principle meridian, resulting in convergence of the beam. The converging beam is focused by the beam focusing lens 30. Due to its convergence from the variable anamorphic lens system 24, the beam forms the focal point 60, shorter than the nominal focal length of the beam focusing lens 30. The beam tracing in FIG. 6 is analogous to the view of the y component in FIG. 4.

In contrast, in FIG. 7, the expanded and collimated beam from BET 14 is not affected by the variable anamorphic lens system 24 in this principal meridian. The collimation of the beam can be maintained in this meridian after the variable anamorphic lens system 24. After passing though the beam focusing lens 30, the collimated beam is focused at the focal point 62, which is formed at a nominal focal length of the beam focusing lens 30. The beam tracing in FIG. 7 is analogous to the view of the x component in FIG. 5. In FIG. 7, the BET 14 increases the incident beam diameter, which is focused by the multi-element beam focusing lens 30, resulting in minimized a beam waist diameter and yielding a highly-resolved focal beam spot. As a result, the target substrate 32 (e.g., a semiconductor wafer) receives a wide and defocused astigmatic beam in one principal meridian and a narrow and sharply focused beam in the other principal meridian.

As illustrated in FIG. 3, the combination of these two separated focal points 60, 62 generates an astigmatic beam spot having one side with a defocused and compressed circumference and the other side with a sharply focused and short circumference.

Scribing Applications Using an Astigmatic Focal Beam Spot

To scribe a substrate, the astigmatic focal beam spot is directed at the substrate and applied with a set of parameters (e.g., wavelength, energy density, pulse repetition rate, beam size) depending upon the material being scribed. According to one method, the astigmatic focal beam spot can be used for scribing semiconductor wafers, for example, in wafer separation or dicing applications. In this method, the wafer can be moved or translated in at least one cutting direction under the focused laser beam to create one or more laser scribing cuts. To cut dies from a semiconductor wafer, a plurality of scribing cuts can be created by moving the wafer in an x direction and then by moving the wafer in a y direction after rotating the wafer 90 degrees. When scribing in the x and y directions, the astigmatic beam spot is generally insensitive to polarization factors because the wafer is rotated to provide the cuts in the x and y directions. After the scribing cuts are made, the semiconductor wafer can be separated along the scribing cuts to form the dies using techniques known to those skilled in the art.

The astigmatic beam spot provides an advantage in scribing applications by enabling faster scribing speeds. The scribing speed can be denoted by $S=(l_b \cdot r_p)/n_d$, where S is the scribing speed (mm/sec), $l_b$ is the length of the focused scribing beam (mm), $r_p$ is pulse repetition rate (pulse/sec) and $n_d$ is the number of pulses required to achieve optimum scribing cut depth. The pulse repetition rate $r_p$ depends on the type of laser that is used. Solid state lasers with a few pulses per second to over $10^5$ pulses per second are commercially available. The number of pulses $n_d$ is a material processing parameter, which is determined by material properties of the target wafer and a desired cut depth. Given the pulse repetition rate $r_p$ and the number of pulses $n_d$, the beam length $l_b$ is a controlling factor to determine the speed of the cut. The focused astigmatic beam spot formed according to the method described above increases the beam length $l_b$, resulting in higher scribing speeds.

Figure 8:
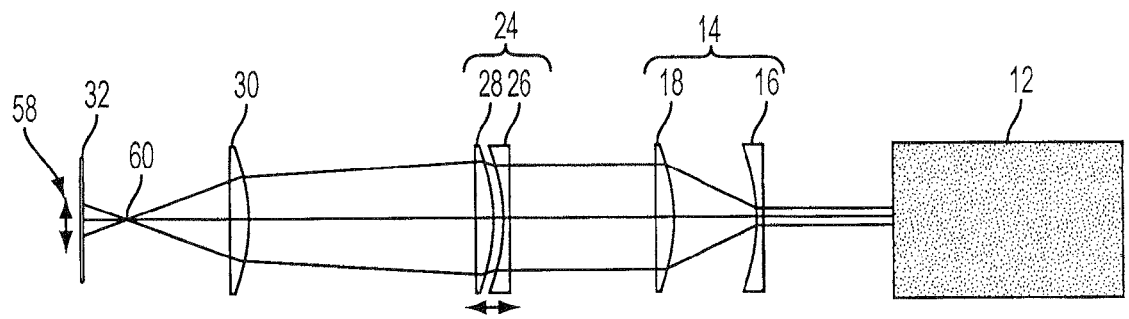
FIGS. 8 and 9 are cross-sectional views of the BDS shown in FIG. 1, illustrating the flexibility of adjusting processing parameters in the BDS.
Figure 9:
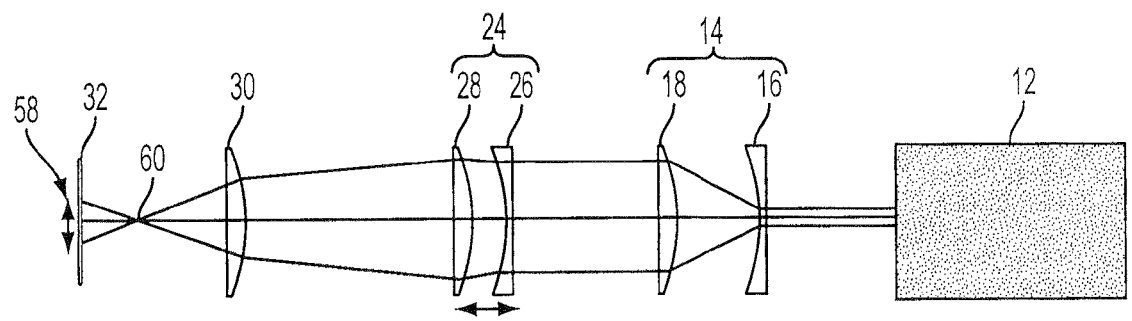

The preferred BDS 14 also provides greater flexibility to adjust processing parameters for achieving an optimum condition. In laser material processing, for example, processing parameters should preferably be adjusted for optimum conditions based on material properties of a target. The overflow of laser energy density can result in detrimental thermal damage to the target, and the lack of laser energy density can cause improper ablation or other undesired results. FIGS. 8 and 9 show the flexibility of adjusting processing parameters of the BDS in this invention.

In FIG. 8, the lenses 26, 28 of the variable anamorphic lens system 24 are placed close together, which results in low convergence of the collimated incident beam. This low convergence forms the focal point 60 at a relatively further distance from the beam focusing lens 30. Consequently, the length of the beam spot 58 is relatively shorter.

In contrast, in FIG. 9, the lenses 26, 28 of the variable anamorphic lens system 24 are placed further apart, which results in high convergence of the collimated incident beam. This increased convergence introduces astigmatism and forms the focal point 60 at a relatively shorter distance from the beam focusing lens 30. Consequently, the length of the beam spot 58 is relatively longer.

In one scribing example, the astigmatic focal beam spot can be used to scribe a sapphire substrate used for blue LEDs. Optimum processing of a sapphire substrate for blue LEDs generally requires an energy density of about 10 J/cm². Since blue LED wafers are generally designed to have about a 50 μm gap among the individual die for separation, the optimum laser beam size is preferably less than about 20 μm for laser scribing. When a currently-available commercial laser with 3 Watts on target output at 50 kHz pulse repetition is used, the conventional beam focusing at a 15 μm diameter results in laser energy density of 34 J/cm². In a system with conventional beam spot focusing, the energy density on target has to be adjusted by reducing the power output of the laser for optimum processing to avoid an overflow. Thus, the laser power output cannot be fully utilized to maximize the scribing speed or productivity.

In contrast, the preferred embodiment of the BDS 10 can adjust the size of the compressed beam spot to maintain the optimum laser energy density for 10 J/cm² without reducing the power output from the laser. The size of the astigmatic beam can be adjusted to have about 150 μm in the astigmatic axis and about 5 μm in the focused axis. Since the astigmatic axis is lined up in the scribing translation direction, this increase in beam length proportionally increases the scribing speed as discussed above. In this example, the astigmatic beam spot can provide processing speeds that are about 10 times faster than that of conventional beam focusing.

In another scribing example, the astigmatic focal beam spot can be used to scribe a sapphire substrate by coupling with one or more GaN layers on the sapphire substrate (e.g., about 4~7 μm over the sapphire substrate) instead of coupling directly with sapphire. The lower bandgap of GaN provides more efficient coupling with the incident laser beam, requiring only about 5 J/cm² for the laser energy density. Once the laser beam couples with GaN, the ablation through the sapphire substrate is much easier than direct coupling with the sapphire. Accordingly, the size of the astigmatic beam can be adjusted to have about 300 μm in the astigmatic axis and about 5 μm in the focused axis. Thus, the processing speed can be 20 times faster than the conventional far field imaging or spot focusing techniques.

Figure 10:
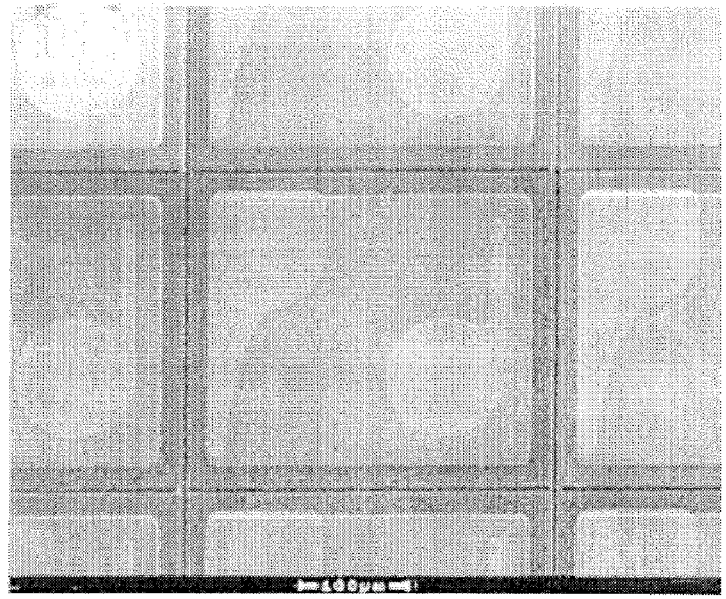
FIG. 10 is a photograph showing a top view of one example of a sapphire-based LED wafer, scribed with the variable astigmatic focal beam spot from the BDS using a 266 nm DPSS laser.
Figure 11:
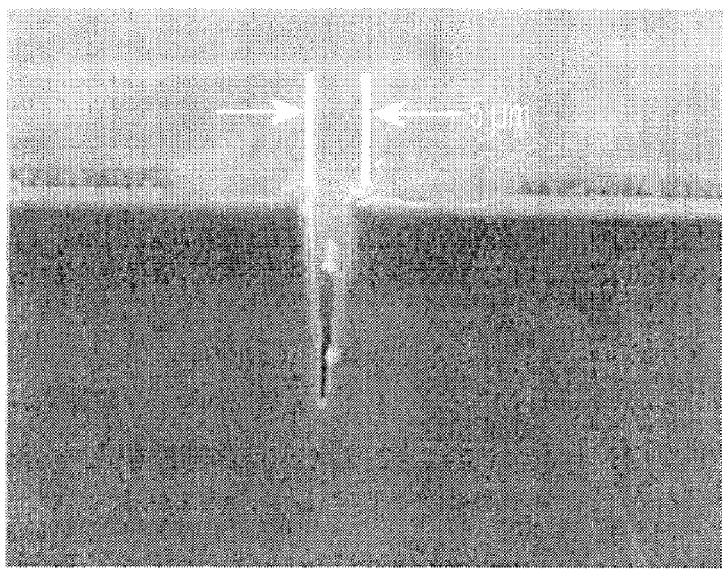
FIG. 11 is a photograph showing a cross-sectional view of one example of a sapphire-based LED wafer, scribed with the variable astigmatic focal beam spot.

The minimized spot size in the focused axis also significantly reduces the scribing kerf width, which subsequently reduces consumption of a wafer real estate. Furthermore, by reducing total removed material volume, the narrow scribing cuts reduce collateral material damage and ablation-generated debris. FIG. 10 shows an example of a sapphire based LED wafer, scribed with the astigmatic focal beam spot from the BDS 10 using a 266 nm DPSS laser with on target power of about 1.8 Watt at 50 kHz. The size of the astigmatic beam was adjusted to have about 180 μm in the astigmatic axis and about 5 μm in the focused axis. Viewed from the top, FIG. 10 shows a cut width of about 5 μm. Based on 30 μm deep scribing, the BDS 10 is capable of scribing speeds of greater than 50 mm/sec. The laser cut forms a sharp V-shaped groove, as shown in FIG. 11, which facilitates well controlled fracturing after the scribing. The variable astigmatic focal beam spot from the adjustable BDS 10 utilizes the maximum power output from the laser, which directly increases the processing speeds. Thus, front side scribing can be used to decrease the street width and increase fracture yield, thereby increasing usable die per wafer.

Figure 12:
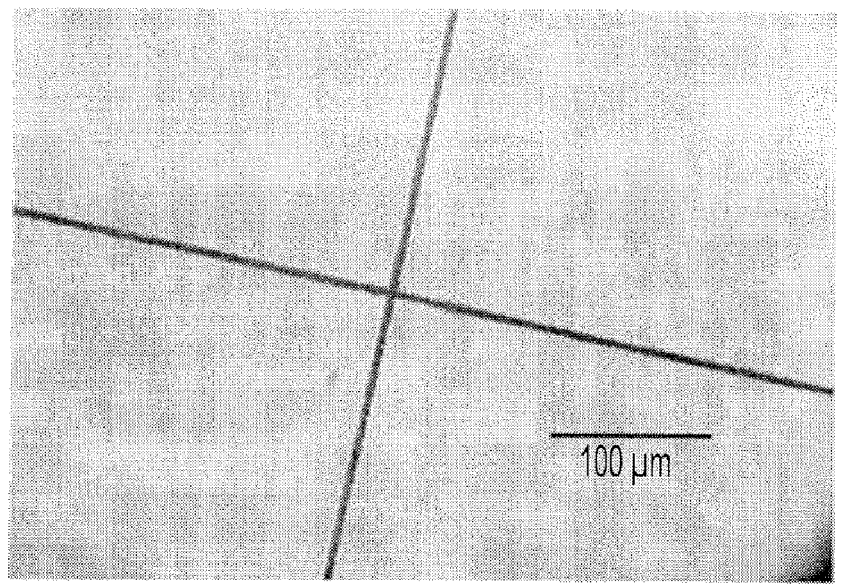
FIG. 12 is a photograph showing a top view of one example of a silicon wafer, scribed with the variable astigmatic focal beam spot from the BDS using a 266 nm DPSS laser.

The astigmatic focal beam spot can also be used advantageously to scribe other types of semiconductor wafers. The astigmatic focal beam spot readily adjusts its laser energy density for an optimum value, based on the target material absorption properties, such as bandgap energy and surface roughness. FIG. 12 shows an example of a silicon wafer, scribed with the astigmatic focal beam spot from the BDS 10 using a 266 nm DPSS laser with on target power of about 1.8 Watt at 50 kHz. The size of the astigmatic beam was adjusted to have about 170 μm in the astigmatic axis and about 5 μm in the focused axis. This resulted in 75 μm deep scribing with a speed at about 40 mm/sec.

Figure 13:
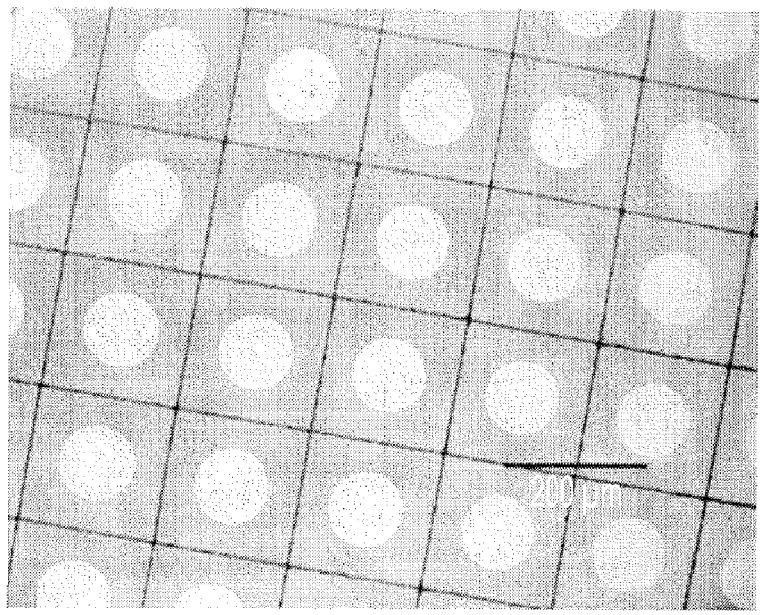
FIG. 13 is a photograph showing a top view of one example of a GaP wafer, scribed with the variable astigmatic focal beam spot from the BDS using a 266 nm DPSS laser.

A comparable result is shown in FIG. 13 for a GaP wafer with the same laser and on target power. The size of the astigmatic beam was adjusted to have about 300 μm in the astigmatic axis and 5 μm in the focused axis. This resulted in 65 μm deep scribing with a speed at about 100 mm/sec. Similar results were found in other compound semiconductor wafers such as GaAs and Ge. Other substrates that can be scribed include, but are not limited to, InP, Alumina, glass and polymers.

Figure 14:
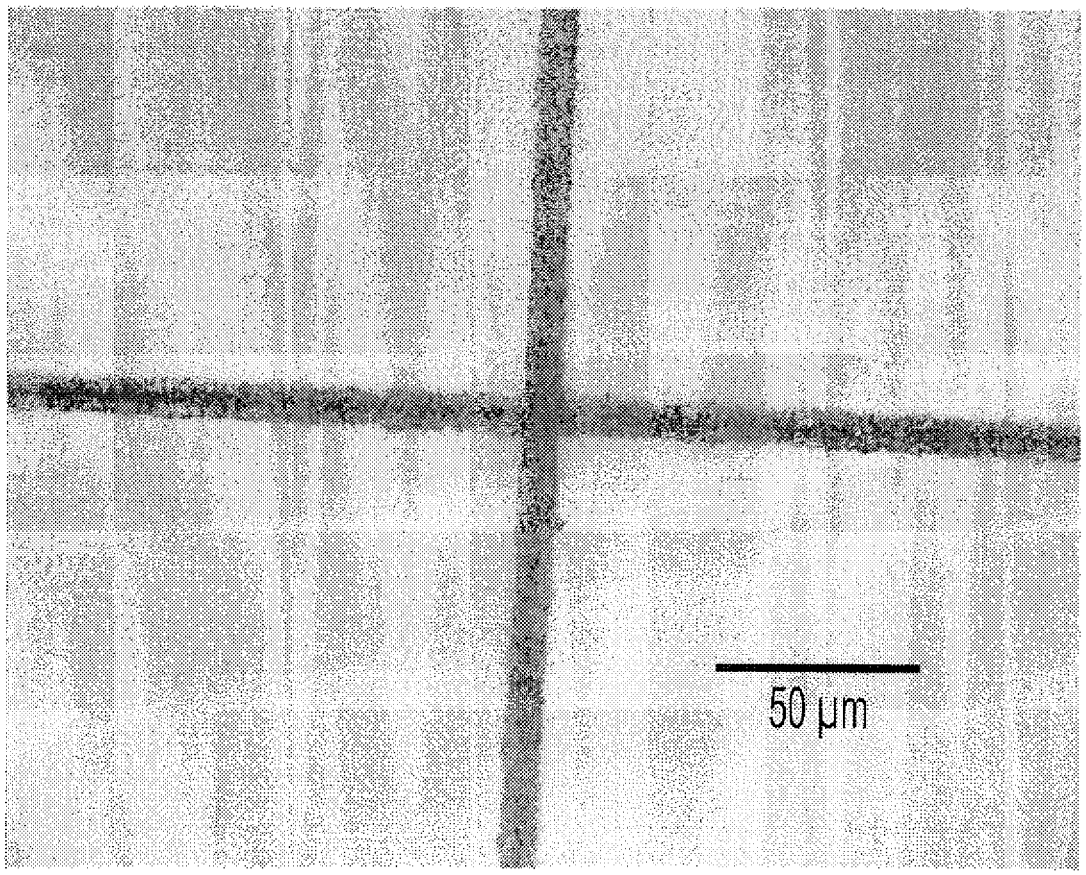
FIG. 14 is a photograph showing a top view of one example of a molybdenum film, scribed with the variable astigmatic focal beam spot from the BDS using a 266 nm DPSS laser.

The astigmatic focal beam spot can also be used advantageously to scribe or machine metal films. Due to high thermal conductivity, laser cutting of metal films using conventional techniques has shown extensive heat affected zones along the wake of the laser cut. With the application of the astigmatic focal beam spot, the 5 μm beam width in the focused axis significantly reduces a laser cutting kerf width, which subsequently reduces heat affected zones, collateral material damage and ablation-generated debris. As an example, FIG. 14 shows narrow and shapely resolved cut lines on molybdenum. The size of the astigmatic beam was adjusted to have about 200 μm in the astigmatic axis and about 5 μm in the focused axis. This resulted in 50 μm deep scribing with a speed at about 20 mm/sec, using 266 nm DPSS laser with on target power of about 2.5 Watt at 25 kHz. Other types of metal can also be cut.

Although the examples show lines scribed in a substrate, the astigmatic focal beam spot can also be used to scribe other shapes or to perform other types of machining or cutting applications. Operating parameters other than those given in the above examples are also contemplated for scribing LED wafers. For example, a 355 nm DPSS laser can also be used for LED scribing applications, although the 266 nm DPSS laser is preferable to minimize the thermal damage that can cause lower light output of the LED.

Figure 15:
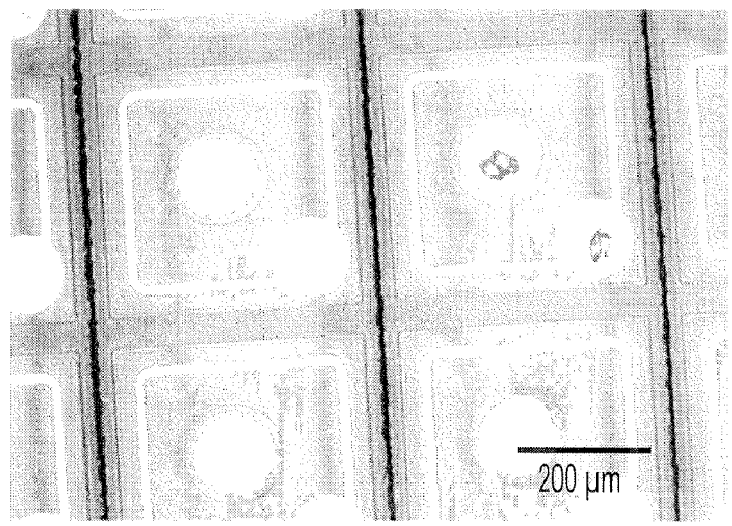
FIG. 15 is a photograph showing one example of laser scribed lines without protective coating.
Figure 16:
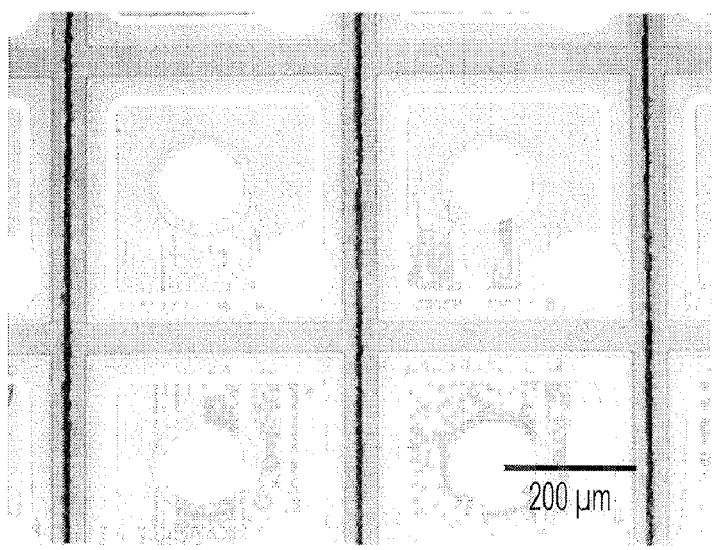
FIG. 16 is a photograph showing one example of laser scribed lines with protective coating.

According to another scribing method, surface protection can be provided on the substrate by using a water soluble protective coating. The preferred composition of the protective coating comprises at least one surfactant in a water-soluble liquid glycerin and can be any kind of generic liquid detergent that satisfies this compositional requirement. The surfactant in the liquid glycerin forms a thin protective layer due to its high wettability. After the thin film layer is dried off, the glycerin effectively endures heat from the laser induced plasma, while preventing laser generated debris from adhering on the surface. The thin film of liquid detergent is easily removed by cleaning with pressurized water. FIG. 14 illustrates the laser scribing on a LED wafer without the surface protection, showing a significant amount of debris accumulated along the laser cut. In contrast, FIG. 15 illustrates the laser scribing on a LED with protective coating using a liquid detergent, which prevented the laser induced debris on the LED surface.

Accordingly, the preferred embodiment of the present invention provides advantages over conventional systems using patterned laser projection and conventional systems using far field imaging. Unlike simple far field imaging, the present invention provides greater flexibility for modifying the laser beam by using the anamorphic BDS to produce the astigmatic focal beam spot. Unlike conventional patterned laser projection, the anamorphic BDS delivers substantially the entire beam from a laser resonator to a target, thus maintaining very high beam utilization. The formation of the astigmatic focal beam spot also allows the laser beam to have excellent characteristics in both the optimum intensity and the beam waist diameter. In particular, the preferred embodiment of the variable anamorphic lens system enables an adjustable uniplanar compression of a laser beam, which results in a variable focal beam spot for prompt adjustments of the optimum laser intensity. By proper modification of beam spot and by maximized utilization of a raw beam, the formation of the astigmatic focal beam spot results in numerous advantages on separation of various semiconductor wafers, including fast scribing speeds, narrow scribing kerf width, reduced laser debris, and reduced collateral damage.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

The invention claimed is:

1. A method for scribing a semiconductor wafer using a laser, said method comprising:
    generating a laser beam;
    forming at least one astigmatic focal beam spot by modifying said laser beam such that said modified beam has two separate focal points and said astigmatic focal beam spot has an elongated shape, wherein forming said astigmatic beam spot uses a beam focusing lens to focus said modified beam such that one of said focal points is shorter than a nominal focal length of said beam focusing lens and the other of said focal points is formed generally at said nominal focal length of said beam focusing lens;
    directing said astigmatic focal beam spot at a surface of said semiconductor wafer, wherein said astigmatic focal beam spot is applied with a set of processing parameters such that said astigmatic focal beam spot causes ablation of said substrate to obtain at least a partial cut in said semiconductor wafer;
    moving said semiconductor wafer in a cutting direction along a length of said astigmatic focal beam spot to make at least a partial cut along at least one line in a first direction on said semiconductor wafer;
    rotating said semiconductor wafer about 90 degrees; and
    moving said semiconductor wafer in a cutting direction along a length of said astigmatic focal beam spot to make at least a partial cut along at least one line in a second direction orthogonal to the first direction on said semiconductor wafer.

2. The method of claim 1 further comprising varying said astigmatic focal beam spot.

3. The method of claim 1 wherein modifying said laser beam includes using an anamorphic lens system to produce said modified beam that is collimated in one principal meridian and converging in another principal meridian, wherein said anamorphic lens system comprises a cylindrical plano-concave lens and a cylindrical plano-convex lens, and further comprising varying said astigmatic focal beam spot by varying a spacing between said cylindrical plano-concave lens and said cylindrical plano-convex lens.

4. The method of claim 1 wherein forming said astigmatic focal beam spot comprises the steps of:
    generating a raw laser beam;
    expanding said raw laser beam;
    modifying said expanded beam such that said modified beam is collimated in one principal meridian and converging in another principal meridian; and
    focusing said modified beam to produce said astigmatic focal beam spot.

5. The method of claim 1 wherein forming said at least one astigmatic focal beam spot includes forming small segments of separated astigmatic beamlets.

6. A beam delivery system comprising:
- a beam expanding telescope for receiving a raw laser beam from a laser and for producing an expanded beam;
- at least one variable anamorphic lens system comprising a cylindrical plano-concave lens and a cylindrical plano-convex lens for receiving said expanded beam and for producing a modified beam collimated in one principal meridian and converging in another principal meridian;
- a beam shaping iris between said beam expanding telescope and said variable anamorphic lens system for cropping out low intensity edges of said expanded beam; and
- a beam focusing lens for receiving said modified beam and focusing said modified beam such that said focused beam has two separate focal points, wherein one of said focal points is shorter than a nominal focal length of said beam focusing lens and the other of said focal points is formed generally at said nominal focal length of said beam focusing lens.

7. The beam delivery system of claim 6 further comprising at least one bi-prism between said beam expanding telescope and said variable anamorphic lens system for dividing said expanded beam.

8. The beam delivery system of claim 6 further comprising a set of bi-prisms between said beam expanding telescope and said variable anamorphic lens system for dividing said expanded beam and controlling separation of said divided beams.

9. The beam delivery system of claim 6 further comprising an array of variable anamorphic lens systems for creating a plurality of separated astigmatic beamlets.

10. A method for scribing a sapphire substrate having a layer of GaN, said method comprising:
- directing pulses of laser energy forming an astigmatic focal beam spot at a surface of said GaN on said sapphire substrate using a solid state laser, wherein said pulses couple laser energy into said GaN layer to induce ablation of said sapphire substrate; and
- causing said pulses to impact said sapphire substrate in a scribe pattern to cut scribe lines in said sapphire substrate.

11. The method of claim 10 further comprising:
- adjusting said astigmatic focal beam spot such that said astigmatic focal beam spot provides an energy density on said sapphire substrate at a target energy density for said sapphire substrate.

12. The method of claim 10 wherein the solid-state laser is a 266 nm diode pumped solid-state (DPSS) laser.

13. A method of cutting a substrate, said method comprising:
- providing an anamorphic beam delivery system including a solid-state laser and a variable anamorphic lens system, the anamorphic beam delivery system being configured to form a variable astigmatic focal beam spot at a variable energy density;
- determining a target energy density for the substrate;
- adjusting the variable anamorphic lens system to vary an aspect ratio of the astigmatic focal beam spot such that the energy density of the astigmatic focal beam spot is provided at the target energy density for the substrate;
- directing the astigmatic focal beam spot on the substrate, the astigmatic focal beam spot having an elongated shape with a focused axis having a first focal point and an astigmatic axis having a second focal point separate from the first focal point, the astigmatic focal beam spot having a length along the astigmatic axis and a width along the focused axis, the width being less than the length; and
- moving the substrate in a cutting direction along the length of the astigmatic focal beam spot such that the astigmatic focal beam spot causes ablation of the substrate to obtain at least a partial cut in the substrate.

14. The method of claim 13 wherein the substrate includes sapphire.

15. The method of claim 14 wherein the target energy density is about 10 J/cm$^2$.

16. The method of claim 14 wherein said substrate includes a GaN layer on said sapphire, and wherein said astigmatic focal beam spot is directed at a surface of said GaN layer such that laser energy is transferred into said GaN layer to cause ablation of said sapphire.

17. The method of claim 16 wherein the target energy density is about 5 J/cm$^2$.

18. The method of claim 13 wherein adjusting the variable anamorphic lens system to vary the astigmatic focal beam spot reduces the energy density of the astigmatic focal beam spot without reducing power output of the laser.

19. The method of claim 13 wherein said astigmatic focal beam spot has a width of less than about 20 μm.

20. The method of claim 13 wherein the substrate is part of a semiconductor wafer, and wherein moving the substrate includes moving the substrate to form a plurality of scribe lines along the semiconductor wafer, and further comprising separating the semiconductor wafer into dies along the plurality of scribe lines.

21. A method for scribing a semiconductor wafer using a laser, said method comprising:
- generating a raw laser beam;
- expanding said raw laser beam;
- modifying said expanded beam such that said modified beam is collimated in one principal meridian and converging in another principal meridian; and
- focusing said modified beam to form an astigmatic focal beam spot such that said modified beam has two separate focal points and said astigmatic focal beam spot has an elongated shape;
- directing said astigmatic focal beam spot at a surface of said semiconductor wafer, wherein said astigmatic focal beam spot is applied with a set of processing parameters such that said astigmatic focal beam spot causes ablation of said substrate to obtain at least a partial cut in said semiconductor wafer;
- moving said semiconductor wafer in a cutting direction along a length of said astigmatic focal beam spot to make at least a partial cut along at least one line in a first direction on said semiconductor wafer;
- rotating said semiconductor wafer about 90 degrees; and
- moving said semiconductor wafer in a cutting direction along a length of said astigmatic focal beam spot to make at least a partial cut along at least one line in a second direction orthogonal to the first direction on said semiconductor wafer.

* * * * *